United States Patent
Cheng et al.

(10) Patent No.: US 10,483,166 B1
(45) Date of Patent: Nov. 19, 2019

(54) VERTICALLY STACKED TRANSISTORS

(71) Applicant: International Business Machines Corporation, Armonk, NY (US)

(72) Inventors: Kangguo Cheng, Schenectady, NY (US); Tenko Yamahita, Schenectady, NY (US); Chun Wing Yeung, Niskayuna, NY (US); Chen Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/018,710

(22) Filed: Jun. 26, 2018

(51) Int. Cl.
*H01L 21/822* (2006.01)
*H01L 21/8238* (2006.01)
(Continued)

(52) U.S. Cl.
CPC .. *H01L 21/8221* (2013.01); *H01L 21/823807* (2013.01); *H01L 21/823814* (2013.01); *H01L 21/823871* (2013.01); *H01L 21/823878* (2013.01); *H01L 21/84* (2013.01); *H01L 23/5226* (2013.01); *H01L 27/092* (2013.01); *H01L 27/1203* (2013.01); *H01L 21/3065* (2013.01); *H01L 29/0673* (2013.01)

(58) Field of Classification Search
CPC ......... H01L 21/8221; H01L 21/823807; H01L 21/823814; H01L 21/823871; H01L 21/823878; H01L 21/3065; H01L 21/84; H01L 23/5226; H01L 27/092; H01L 27/1203

See application file for complete search history.

(56) References Cited

U.S. PATENT DOCUMENTS 6,518,112 B2   2/2003   Armacost et al.
8,183,104 B2   5/2012   Hobbs et al.
(Continued)

OTHER PUBLICATIONS

Cheng, Kangguo et al., "Formation of Stacked Nano sheet Semiconductor Devices"; U.S. Appl. No. 16/018,696, filed Jun. 26, 2018.
(Continued)

*Primary Examiner* — Allan R Wilson
(74) *Attorney, Agent, or Firm* — Cantor Colburn LLP; Vazken Alexanian

(57) ABSTRACT

A method of fabricating a vertically stacked nanosheet semiconductor device includes epitaxially growing at least three layers each of alternating silicon and silicon germanium layers on a substrate and patterning a gate structure. The method includes performing at least three reactive ion etch processes forming recesses. The method includes forming source or drain regions in a channel formed by a shallow trench isolation layer formed in the recesses. The method includes growing a first epitaxial layer on the source or drain regions, forming at least three pFET structures. The method includes etching away a portion of each of the pFET structures and depositing a dielectric layer on each. The method includes growing a second epitaxial layer, forming at least three nFET structures. Each layer of the pFET structure and nFET structure are stacked vertically and each layer of the pFET structure and nFET structures have independent source or drain contacts.

16 Claims, 8 Drawing Sheets

(51) Int. Cl.
  *H01L 21/84*   (2006.01)
  *H01L 23/522*  (2006.01)
  *H01L 27/092*  (2006.01)
  *H01L 27/12*   (2006.01)
  *H01L 21/3065*     (2006.01)
  *H01L 29/06*       (2006.01)

(56) References Cited

U.S. PATENT DOCUMENTS

| | | |
|---|---|---|
| 8,216,902 B2 | 7/2012 | Chang et al. |
| 8,466,451 B2 * | 6/2013 | Chang ................ H01L 27/1203 257/24 |
| 9,129,829 B2 | 9/2015 | Kuhn et al. |
| 9,472,558 B1 | 10/2016 | Cheng et al. |
| 9,490,323 B2 | 11/2016 | Rodder et al. |
| 9,583,491 B2 | 2/2017 | Kim et al. |
| 9,711,414 B2 | 7/2017 | Hatcher et al. |
| 9,773,913 B1 * | 9/2017 | Balakrishnan .... H01L 29/78618 |
| 9,871,140 B1 | 1/2018 | Balakrishnan et al. |
| 10,096,607 B1 * | 10/2018 | Guillorn ............. H01L 21/8221 |
| 10,192,867 B1 * | 1/2019 | Frougier ........... H01L 29/66439 |
| 10,236,217 B1 | 3/2019 | Ando |
| 2010/0295021 A1 | 11/2010 | Chang |
| 2011/0031473 A1 * | 2/2011 | Chang .................... B82Y 10/00 257/24 |
| 2016/0086951 A1 | 3/2016 | Kim |
| 2016/0211276 A1 * | 7/2016 | Liu ..................... H01L 27/1211 |
| 2017/0018462 A1 | 1/2017 | Suk |
| 2017/0323953 A1 | 11/2017 | Cheng et al. |
| 2018/0047832 A1 | 2/2018 | Tapily |

OTHER PUBLICATIONS

List of IBM Patents or Patent Applications Treated as Related; (Appendix P), Filed Aug. 21, 2018, 2 pages.

Ming-Long Fan et al., "Stability and performance optimization of heterochannel monolithic 3-D SRAM cells considering interlayer coupling," IEEE Transactions on Electron Devices, vol. 61, No. 10, 2014, pp. 3448-3455.

* cited by examiner

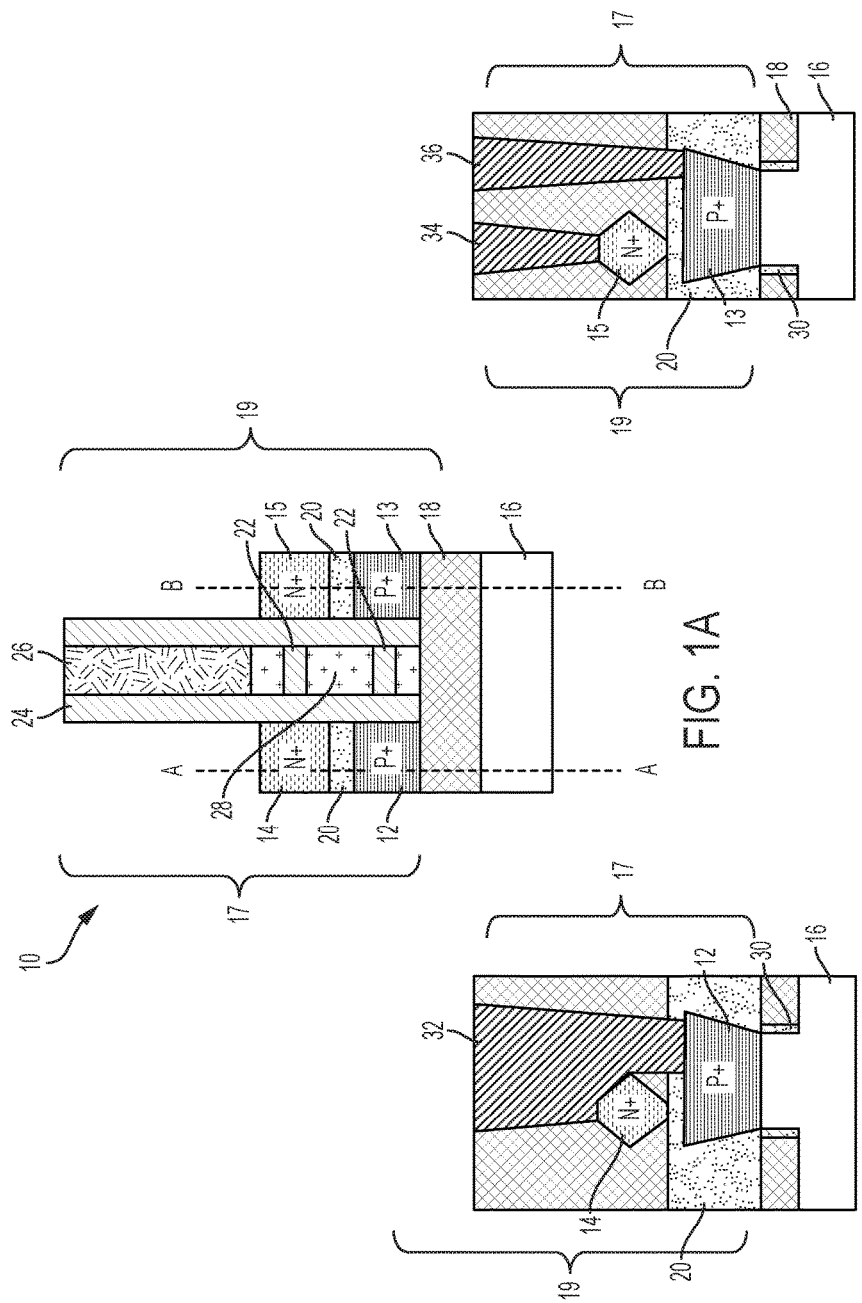

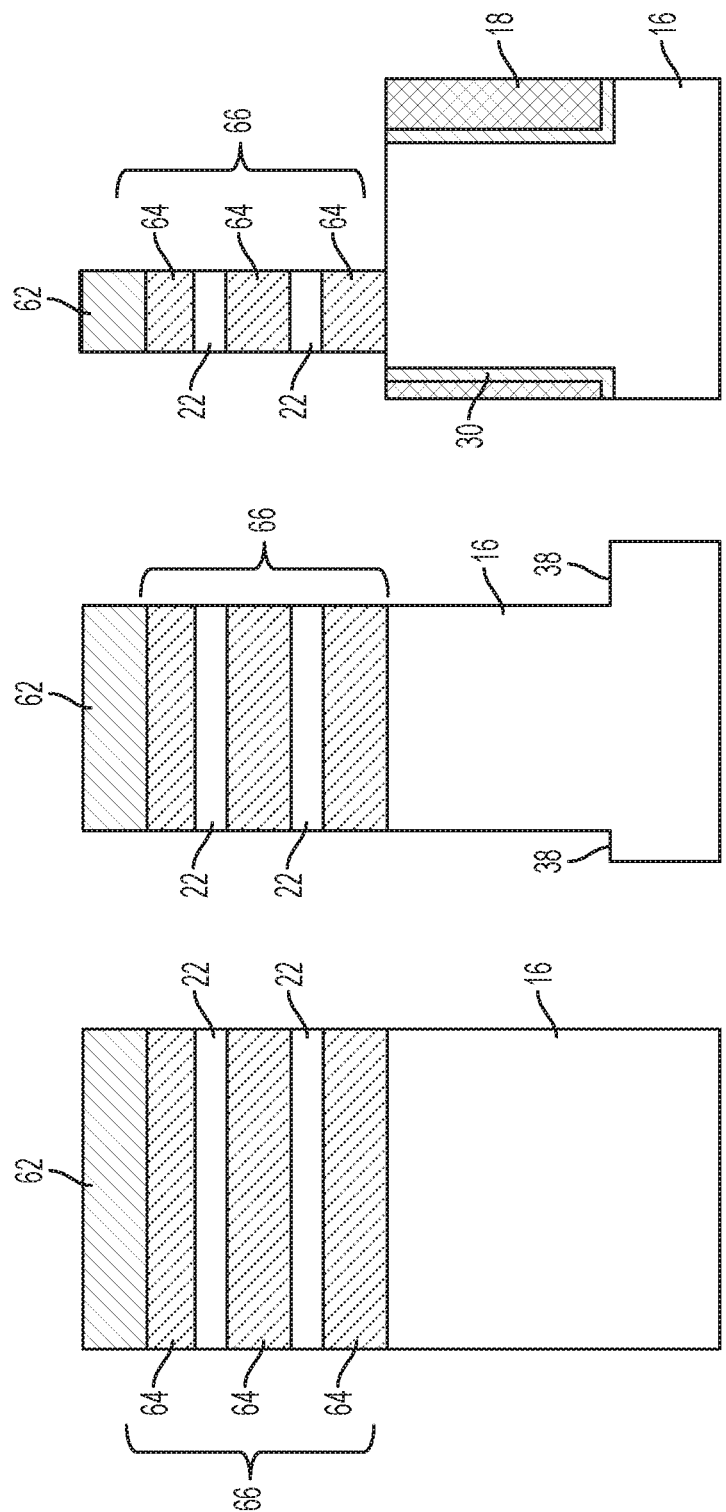

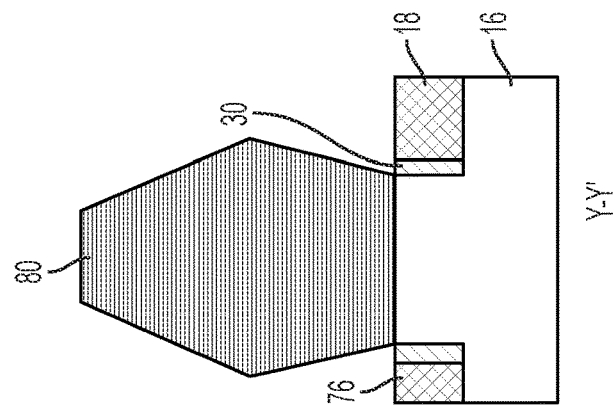
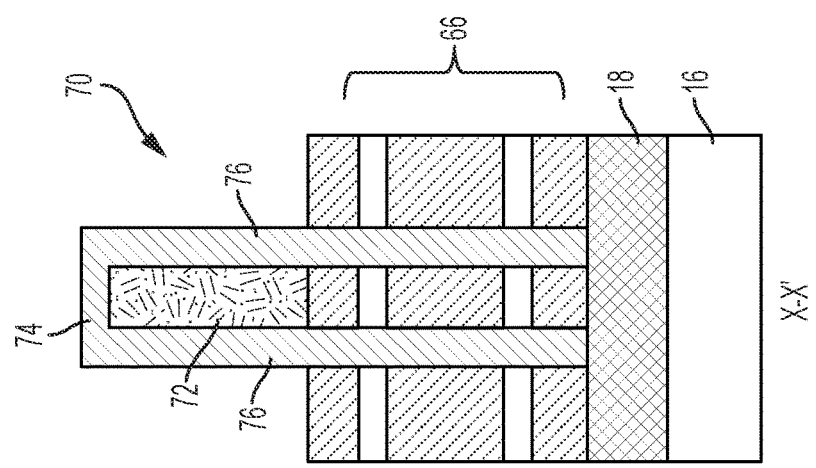
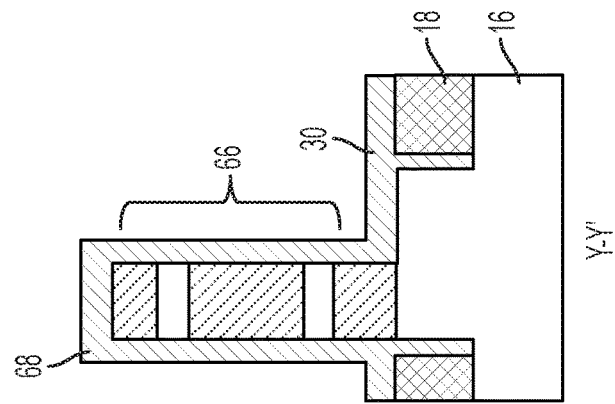

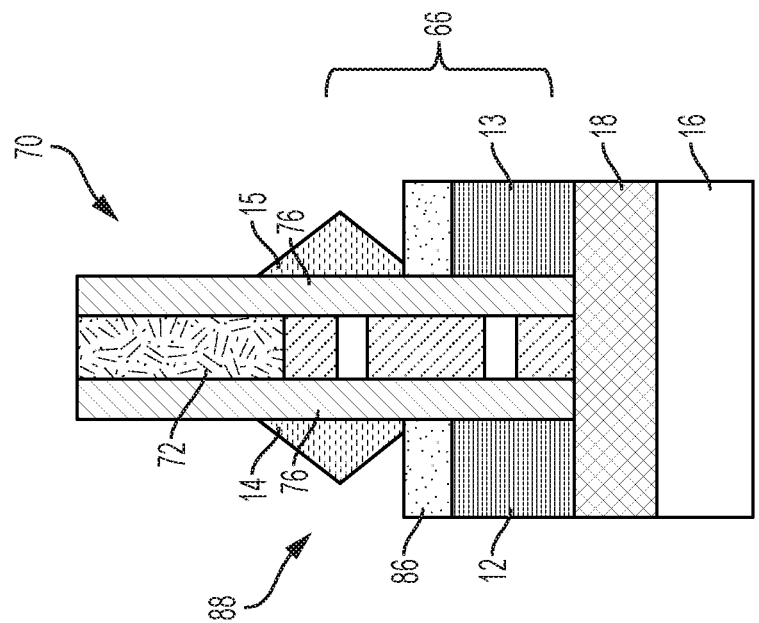
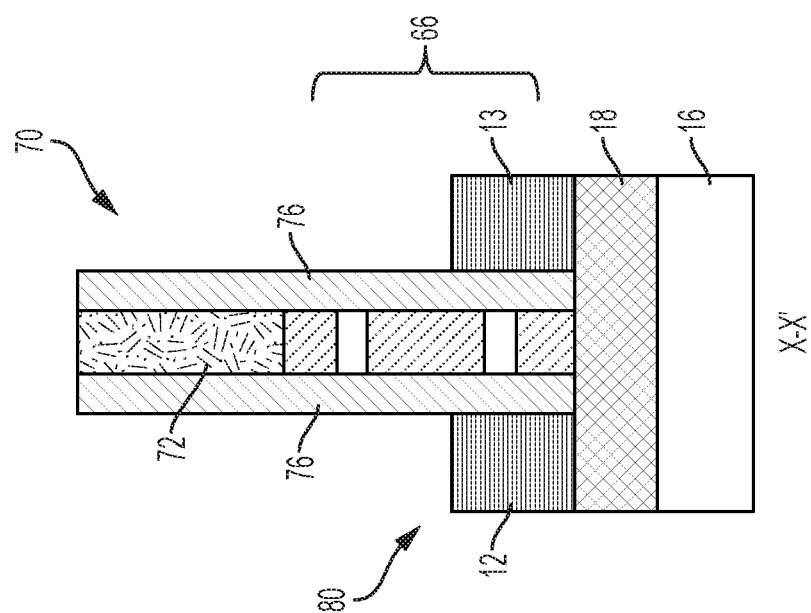

VERTICALLY STACKED TRANSISTORS

BACKGROUND

The present invention generally relates to fabrication methods and resulting structures for semiconductor devices. More specifically, the present invention relates to vertically stacked transistors and the formation thereof.

As semiconductor integrated circuits (ICs) or chips become smaller, the implementation of stacked transistors in semiconductor devices has increased. Nanosheet transistors are non-planar semiconductor devices that utilize two-dimensional nanostructures (e.g., nanosheets or nanowires) with a thickness range on the order of about 1 nanometer (nm) to about 100 nm. Nanosheet transistors have a reduced footprint compared to conventional planar-type semiconductor devices. Accordingly, nanosheet transistors are seen as an option for reducing the footprint of semiconductor devices to 7 nanometers and beyond.

SUMMARY

Embodiments of the present invention are directed to a method of fabricating a vertically stacked nanosheet semiconductor device. A non-limiting example of the method includes forming a nanosheet stack by epitaxially growing alternating layers of a first material and a second material on a substrate and patterning a gate structure on the nanosheet stacks. The method further includes performing a first reactive ion etch on the nanosheet stack forming recesses on the substrate. The method further includes performing a second reactive ion etch on the alternating layers of a first material and a second material. The method further includes depositing inner spacers and a shallow trench isolation layer in the recesses. The method further includes forming source or drain (S/D) regions in a channel formed by the shallow trench isolation layer. The method further includes growing a first epitaxial layer on the source or drain regions, forming a first pFET structure and a second pFET structure. The method further includes etching away a portion of the first pFET structure and the second pFET structure and depositing a dielectric layer on the first pFET structure and the second pFET structure. The method further includes growing a second epitaxial layer on the source or drain regions, forming a first nFET structure and a second nFET structure. At least one of the first pFET structure and the first nFET structure or the second pFET structure and the second nFET structure have individual contacts. The individual contacts enable independent voltage control across the semiconductor device.

Embodiments of the present invention are directed to a method of fabricating a vertically stacked nanosheet semiconductor device. A non-limiting example of the method includes epitaxially growing at least three layers each of alternating silicon and silicon germanium layers on a substrate, forming a nanosheet stack, and patterning a gate structure on the nanosheet stacks. The method further includes performing at least three reactive ion etch processes on the nanosheet stack, forming recesses on the substrate. The method further includes forming source or drain (S/D) regions in a channel formed by a shallow trench isolation layer formed in the recesses. The method further includes growing a first epitaxial layer on the source or drain regions, forming at least three pFET structures. The method further includes etching away a portion of each of the pFET structures and depositing a dielectric layer on the each pFET structure. The method further includes growing a second epitaxial layer on the source or drain regions, forming at least three nFET structures. Each layer of the pFET structure and nFET structure are stacked vertically and each layer of the pFET structure and nFET structures have independent source or drain contacts.

Embodiments of the invention are directed to a vertically stacked nanosheet semiconductor device. The device includes at least three layers of vertically stacked pFET structure and nFET structure devices on a nanosheet stack, wherein each layer has an independent source or drain contact.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1A depicts a cross-sectional view of a semiconductor device at an intermediate stage of a semiconductor fabrication process flow in accordance with aspects of the invention;

FIG. 1B depicts a cross-sectional view of the device of FIG. 1A taken along line A-A;

FIG. 1C depicts a cross-sectional view of the device of FIG. 1A taken along line B-B;

FIG. 2A depicts a cross-sectional view of an intermediate semiconductor device with a nanosheet stack in accordance with aspects of the invention;

FIG. 2B depicts a cross-sectional view of the intermediate semiconductor device of FIG. 2A after reactive ion etching;

FIG. 2C depicts a cross-sectional view of the intermediate semiconductor device of FIG. 2B after the deposition of inner layers and a shallow trench isolation layer;

FIG. 3A depicts a cross-sectional view of an intermediate semiconductor device with spacers taken along line Y-Y' in FIG. 3E;

FIG. 3B depicts a cross-sectional view of the intermediate semiconductor device of FIG. 3A after a replacement metal gate process taken along line X-X' in FIG. 3E;

FIG. 3C depicts a cross-sectional view of the intermediate semiconductor device of FIG. 3B with a pFET structure taken along line Y-Y' in FIG. 3E;

FIG. 4A depicts a cross-sectional view of the intermediate semiconductor device of FIG. 3D after a partial etching of the pFET structure taken along line X-X' in FIG. 5E;

FIG. 4B depicts a cross-sectional view of the intermediate semiconductor device of FIG. 4A with a first nFET structure and a second nFET structure taken along line X-X' in FIG. 5E;

Figure 3D:
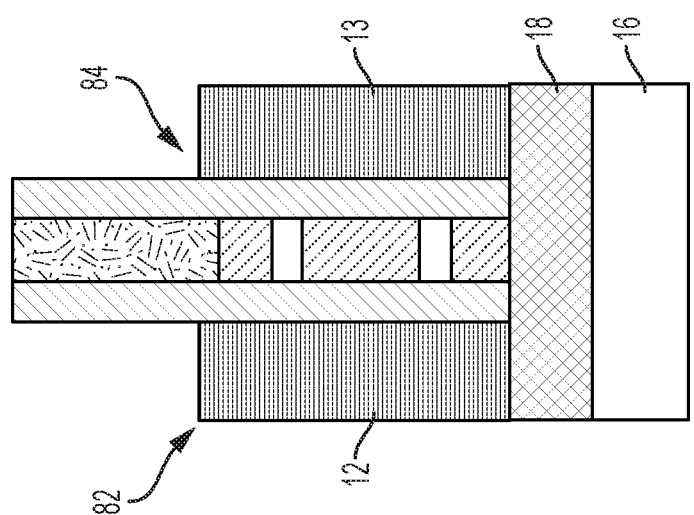
FIG. 3D depicts a cross-sectional view of the intermediate semiconductor device of FIG. 3C with a first pFET structure and a second pFET structure taken along line X-X' in FIG. 3E.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, nanosheet semiconductor devices typically include one or more suspended nanosheets that serve as the channel. An epitaxy process is typically performed to grow source or drain epitaxy structures from the surface of the wafer to contact the opposing ends of the nanosheets. A metal source or drain contact is then typically formed on the upper surface of the source or drain epitaxy structure to provide the final source or drain contacts of the device. As fabrication trends aim to continue reducing the footprints of semiconductor devices, the total contact area between the upper surface of the source or drain epitaxy structure and the lower surface of the metal source or drain contact is reduced. As a result, the overall resistance in the source or drain region increases, which can reduce the overall performance of the device. Furthermore, for each new technology presented, it must be scalable for at least one more generation because it is not financially prudent to invest in research and development to enable new technology for just one technology node and then become obsolete.

To be scaled for the next generation, area scaling is an area to consider. In nanosheet semiconductor devices, area scaling generally refers to contact poly pitch (CPP) scaling. For nanosheets, CPP scaling has already approached the physical or engineering limit of reducing the length of the gate (Lgate), the length of the contact (Lcontact), or the thickness of the spacer (Tspacer). Vertically stacked transistors can enable area scaling of 30%, which is enough for one generation scaling. It can desirable, however to increase the area scaling even further to allow for greater than one generation scaling.

Turning now to an overview of the aspects of the invention, one or more embodiments of the invention address the above-described shortcomings of the prior art by providing a three-dimensional vertically stacked nanosheet semiconductor device in which area scaling can be enabled to at least 40%, and even, 50%. In the three-dimensional vertically stacked nanosheet semiconductor device described, the vertically stacked pFET structure and nFET structure devices on the three-dimensional nanosheet can have individual contacts. The use of individual contacts can enable independent voltage control across the semiconductor device. A method of making the three-dimensional vertically stacked nanosheet semiconductor device can include performing multiple epitaxial growth processes to grow epi regions on a nanosheet stack to form the pFET structure and nFET structure devices with individual contacts. This feature is possible with a wider source/drain structures in a bottom transistor so top and bottom transistors can be biased independent to allow logic operations. The semiconductor device also has stacked horizontal gate all-around transistors.

In another embodiment, aspects of the invention address the shortcomings of the prior art by providing a vertically stacked nanosheet semiconductor device with at least three layers of vertically stacked pFET structure and nFET structure devices on a nanosheet stack. Each layer of pFET structures and nFET structures has an independent source or drain contact. The vertically stacked nanosheet semiconductor device can be made by epitaxially growing at least three layers of alternating silicon and silicon germanium layers on a substrate. Etching processes can be performed to form the source or drain regions in which the pFET structure and nFET structure devices will be vertically stacked. The number of layers to be stacked is not limited and can generally be greater than or equal to 3.

Turning now to a more detailed description of aspects of the present invention, FIG. 1A depicts a semiconductor device 10 according to embodiments of the invention. FIG. 1B and FIG. 1C depict cross-sectional views of the semiconductor device of FIG. 1, taken along lines A-A and B-B, respectively. As shown in FIG. 1A, by vertically stacking the three-dimensional semiconductor device, the overall area can be reduced, by greater than or equal to 40%, leading to greater than one generation scaling. As shown in FIG. 1A, doped layers (e.g., first and second P+ doped layers 12, 13) and doped layers (e.g., first and second N+ doped layers 14, 15) are vertically stacked on a substrate 16 and a shallow trench isolation layer 18 with a dielectric layer 20 disposed between the first P+ doped layer 12 and the first N+ doped layer 14 and between the second P+ doped layer 13 and the second N+ doped layer 15. Doped N+ can be used for building an nFET structure (n-type), while doped P+ can be used for building a pFET structure (p-type). Doped layers 12, 13 can form source/drain regions 12, 13 in forming a pFET structure and doped layers 14, 15 can form source/drain regions 14, 15 in forming an nFET structure. The substrate 16 is shown as a bulk semiconductor substrate which can be implemented as a semiconductor-on-insulator substrate (SOI). The substrate 16 can include a buried insulator layer (not shown) such as a buried oxide layer (BOX). The substrate 16 is composed of silicon (Si) and the optional BOX layer is composed of silicon oxide ($SiO_2$).

A channel 22 is present in each of a pFET structure 17 and an nFET structure 19 with a spacer 24 dispersed along the semiconductor device 10. As noted in FIG. 1A, the pFET structure 17 and the nFET structure 19 share the same gate 26. Although as shown in FIG. 1A as a pFET structure on an nFET structure, it is to be understood that the vertical stacking can include any combination of the devices, include, but not limited to, nFET structure on nFET structure, pFET structure on pFET structure, nFET structure on pFET structure, or pFET structure on nFET structure.

FIGS. 1B and 1C both demonstrate an nFET structure on pFET structure device with inner spacers 30 surrounding the substrate 16. In FIG. 1B, the pFET structure 17 and nFET structure 19 share a common contact (e.g., a merged contact) 32, while in FIG. 1C, the pFET structure 17 has a pFET structure contact 34 and the nFET structure 19 has an nFET structure contact 36.

The independent contacts enable independent voltage control across the semiconductor device 10. The merged contact shape can differ from the individual contact shape. The first and second pFET structure and the first and second nFET structure can share a common gate. The first pFET structure and the first nFET structure and the second pFET structure and the second nFET structure are disposed vertically to one another.

Turning now to FIG. 2A to 2C, an embodiment of making a three-dimensional semiconductor device according to aspects to the invention is shown. A substrate 16 with a nanosheet stack 66 is grown on the substrate 16 is shown in FIG. 2A. The nanosheet stack 66 can be epitaxially grown on the substrate 16. For example, alternating layers of a first material 22 and a second material 64 (e.g., silicon 22 and silicon germanium 64) can be epitaxially grown on the substrate 16.

The nanosheet stack 66 is formed as an alternating stack of silicon germanium layers 64 and silicon layers 22. Multiple epitaxial growth processes can be performed to form the silicon germanium layers 64 and silicon layers 22. In embodiments of the invention where the substrate 16 is implemented as an SOI structure, to achieve a silicon germanium layer 64 directly on the upper surface of the substrate 16, for example, a SiGe layer is first epitaxially grown on an upper surface of an initial SOI layer (not shown). Thereafter, the SiGe layer is condensed using a thermal oxidation process, for example, that results in the Si in the SiGe layer being consumed (by the oxidation process) while the Ge is driven down into the initial SOI layer (not shown). The thermal oxidation process includes, for example, exposing the initial SiGe layer to a temperature of about 900° Celsius (C) to about 1,200° C., e.g., about 1,100° C. for a duration of about 5 minutes to about 15 minutes, in $O_2$.

It should be appreciated that the alternating series of SiGe layers 64 and Si layers 22 can be either relaxed or strained. For example, if grown to a certain thickness or with a low Ge concentration, the layers 64 and 22 will be relaxed due to dislocation defects. However, increasing the concentration of Ge, for example, can strain the alternating series of SiGe layers 64 and Si layers 22.

After the nanosheet stack 66 has been grown, a hardmask layer 62 is deposited on a top layer of the nanosheet stack 66 illustrated in FIG. 2A. The hardmask layer 62 can be composed of various nitride materials including, but not limited to, silicon nitride (SiN). After the hardmask layer 62 is deposited, a first etching process is performed on the stack, for example, a first reactive ion etching process as shown in FIG. 2B. In this first reaction ion etching process, a portion of the substrate 16 and each of the layers of the nanosheet stack 66 and the hardmask layer 62 are etched away forming recesses 38. The recesses 38 will form source and drain regions. A second reactive ion etching process is performed in FIG. 2C in order to remove further portions of the nanosheet stack 66. Inner spacers 38 are formed in the recesses and a shallow trench isolation layer 18 is formed on the inner spacers 30 as shown in FIG. 2C. The source and drain regions 38 can be wider in this section to allow for independent biasing of the contacts to allow logic operations.

Turning now to FIGS. 3A to 3E, further features of the method are described. In FIG. 3A, which is a cross-sectional view of FIG. 3E taken along line Y-Y', a spacer deposition process occurs to place spacers 68 along the nanosheet stack 66. After the spacer deposition process, a gate structure 70 is patterned on the nanosheet stack 66 as shown in FIG. 3B, which is a cross-sectional view of FIG. 3E taken along line X-X'. The gate structure 70 includes a sacrificial (or dummy) gate material 72, a hardmask cap 74, and opposing gate spacers 76. The sacrificial gate material 72 can be composed, for example, of polysilicon (PolySi). Although not illustrated, the gate structure 70 can also include a sacrificial dummy gate dielectric interposed between the nanosheet stack 66 and the sacrificial gate material 72. When present, the sacrificial dummy gate dielectric can be composed of various oxide materials including, but not limited to, $Si_xO_yH_z$. The height of the sacrificial gate material 72 (including the dummy gate dielectric, if present) can be, for example, from about 20 nanometers (nm) to about 100 nm.

The hardmask cap 74 is formed on an upper surface of the sacrificial gate material 72. The hardmask cap 74 can be composed of various nitride materials including, but not limited to, silicon nitride (SiN). The spacers 68 are formed on opposing outer sidewalls of the sacrificial gate material 72 and the hardmask cap 74. The spacers 68 can be composed of SiBCN. SiBCN also has a dielectric constant (k) that is less than conventional SiN spacers. Accordingly, the overall capacitance of the gate structure 70 can be reduced compared to conventional gate structures.

Figure 3E:
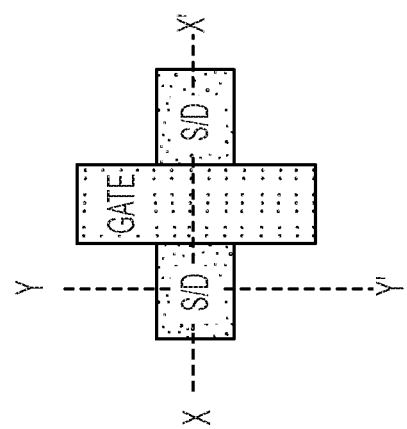
FIG. 3E depicts a cross-sectional view of a gate and source or drain region of an intermediate semiconductor device.

Turning now to FIG. 3C, which is a cross-sectional view of FIG. 3E taken along line Y-Y' and FIG. 3D, which is a cross-sectional view of FIG. 3E taken along line X-X', portions of the nanosheet stack 66 not covered by the gates structure 70 are etched away to form recesses 76. Epitaxial regions 80 (e.g., a first epitaxy layer 80) are formed in the recesses 76. The epitaxial regions 80 will function as a source and drain. Recesses (not shown) can be formed in end regions of the silicon germanium layer 64 and filled with a dielectric material to form inner spacers (not shown). The dielectric material can include SiN, for example, and can be deposited according to a conformal deposition processes (not shown) that applies a conformal dielectric layer along the outer sides of the nanosheet stack 66 and the upper surface of the substrate 16. An atomic layer deposition (ALD) process can be performed to achieve the conformal deposition of the dielectric material. In this manner, the dielectric material fills recesses in end regions of the silicon germanium layers 64 to form the inner spacers.

A first epitaxy layer 80 is grown on the recesses 76 in FIG. 3C. The first epitaxy layer 80 can function as the source or drain and thus can also be termed an epitaxially grown source or drain (S/D) region 80. The first epitaxy layer 80 can include silicon, silicon germanium, pure silicon, or a combination including at least one of the foregoing. Pure silicon as described herein generally refers to silicon epitaxy with in-situ P doping. The silicon germanium layers 64 have a vertical thickness of, for example, approximately 3 nm to approximately 10 nm. The silicon layers 22 have a vertical thickness of, for example, approximately 3 nm to approximately 10 nm.

The first epitaxial layer 80 can be doped to form a p-type semiconductor device or an n-type semiconductor device. When forming a p-type semiconductor device, the active semiconductor layers can be doped with, for example, phosphorus (P) or arsenic (As). When forming an n-type semiconductor device, the active semiconductor layers can be doped with, for example, boron (B) or gallium (Ga). An annealing process (not shown) can be performed to activate the dopants implanted in the first epitaxial layer 80. Source/drain regions 12, 13 are formed.

Turning now to FIGS. 4A and 4B, formation of the nFET structures is illustrated. In FIG. 4A which is a cross-sectional view taken along line X-X' in FIG. 3E, a portion of the first epitaxy layer 80 is etched away (e.g., via reactive ion etching), i.e., a portion of the first pFET structure 12 and the second pFET structure 13. An interlayer dielectric 86 is deposited on the first pFET structure 12 and the second pFET structure 13 as shown in FIG. 4B. Referring to 4B, a deposition and chemical mechanical planarization (CMP) process has been utilized to deposit and planarize an interlayer dielectric (ILD) region 86 to cover the first. The ILD region 86 is composed of a flowable oxide material such as polymer hydrogen silsesquioxane (HSQ) solution in methyl isobutyl ketone (MIBK), for example, and can be deposited on an upper surface of the substrate 16 to completely cover or encapsulate the first epitaxy layer 80.

A portion of the ILD 86 can be partially etched to expose a top portion of the first epitaxy layer 80, while preserving the gate structure 70, and the nanosheet stack 66 (not shown). Subsequently, selective etching can be used to remove the exposed portions of the first epitaxy layer 80 leaving a recess (not shown).

In FIG. 4B, a second epitaxial layer 88 has been grown on the ILD region 86. The etching process can be a selective reaction ion etching process that removes only a portion of the ILD 86, leaving the gate structure 70 untouched. The second epitaxy layer 86 can include silicon, silicon germanium, or pure silicon epitaxy (SiP), which is silicon epitaxy with in-situ p doping. A first nFET structure 19 and a second nFET structure 19 are formed as shown in FIG. 4B.

Figure 5:
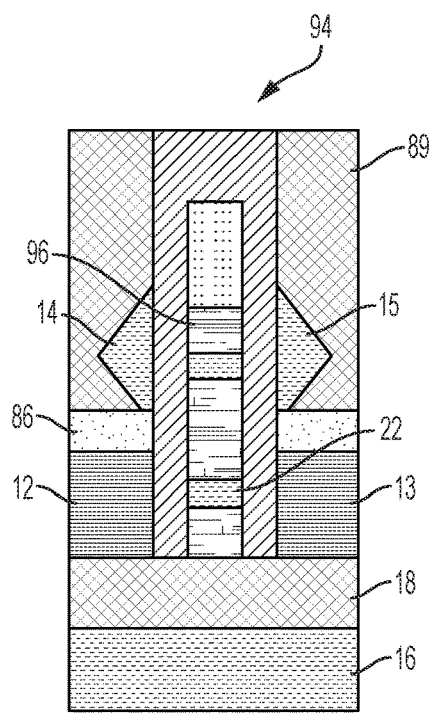
FIG. 5 depicts a cross-sectional view of a completed semiconductor device.

In FIG. 5, an insulator layer 89 is filled to cover the second epitaxial layer 88. The insulator layer 89 can be a flowable oxide material such as polymer hydrogen silsesquioxane (HSQ) solution in methyl isobutyl ketone (MIBK), for example, and can be deposited on an upper surface of the substrate 16 to completely cover or encapsulate the first epitaxy layer 80. In one more embodiments of the invention, a subsequent planarization process (not shown) can be performed. The planarization process can be selective to the ILD 86 so that the process stops on the upper surface of the gate cap 74 and spacers 68. In this manner, the upper surface of the ILD 86 can be flush (i.e., co-planar) with respect to the upper surface of the gate cap 74 and the spacers 68.

In FIG. 5, a pull down of the sacrificial gate material 72 and the hardmask cap 74 has been performed to allow the formation of a gate replacement structure 94. Additionally, the sacrificial SiGe layers 64 were removed with a selective etching process and replaced with metal layers, such as work function metal layers 96. The gate replacement structure 94 includes an electrically conductive material composed of tungsten (W) or aluminum (Al), for example, which can be deposited after the pull down according to a chemical vapor deposition (CVD) process. One or more work function metal layers 96 can be deposited prior to depositing the gate replacement structure 94. The work function metal layers 96 can include layers of titanium nitride or TiAlC (depending upon the type of transistor device being manufactured).

An area of the nanosheet semiconductor device 10 can be reduced by at least 40%, and even 50% as compared to a semiconductor device without vertical stacking of the pFET structure and nFET structure.

Figures 6A, 6B:
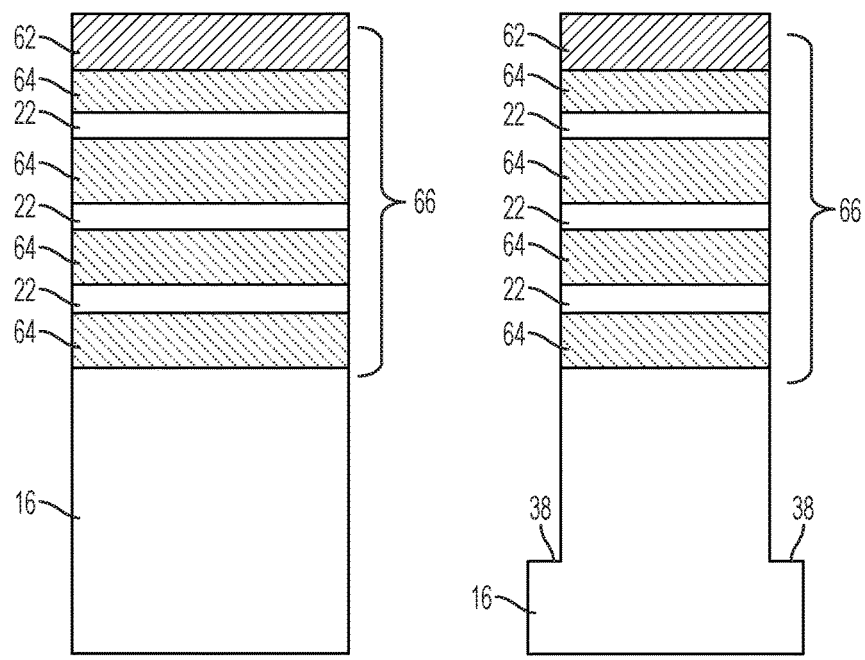
FIG. 6A depicts a cross-sectional view of an intermediate semiconductor device with multiple epitaxial layers grown on a substrate.
FIG. 6B depicts a cross-sectional view of the intermediate semiconductor device of FIG. 8A after a first reaction ion etch process.

Turning now to FIG. 6A-6E, another method of forming a three-dimensional nanosheet semiconductor 102 is shown. FIG. 6A shows epitaxial growth of multiple layers of SiGe 64 and Si 22 with a hardmask 62 on top of the nanosheet stack. Greater than or equal to 3 layers of SiGe 64 and Si 22 are grown. Multiple epitaxial growth processes can be performed to form the silicon germanium layers 64 and silicon layers 22. In embodiments of the invention where the substrate 16 is implemented as an SOI structure, to achieve a silicon germanium layer 64 directly on the upper surface of the substrate 16, for example, a SiGe layer is first epitaxially grown on an upper surface of an initial SOI layer (not shown). Thereafter, the SiGe layer is condensed using a thermal oxidation process, for example, that results in the Si in the SiGe layer being consumed (by the oxidation process) while the Ge is driven down into the initial SOI layer (not shown). The thermal oxidation process includes, for example, exposing the initial SiGe layer to a temperature of about 900° Celsius (C) to about 1,200° C., e.g., about 1,100° C. for a duration of about 5 minutes to about 15 minutes, in 02.

It should be appreciated that the alternating series of SiGe layers 64 and Si layers 22 can be either relaxed or strained. For example, if grown to a certain thickness or with a low Ge concentration, the layers 64 and 22 will be relaxed due to dislocation defects. However, increasing the concentration of Ge, for example, can strain the alternating series of SiGe layers 64 and Si layers 22.

After the nanosheet stack 66 has been grown, a hardmask layer 62 is deposited on a top layer of the nano sheet stack 66. The hardmask layer 62 can be composed of various nitride materials including, but not limited to, silicon nitride (SiN).

Figure 6E:
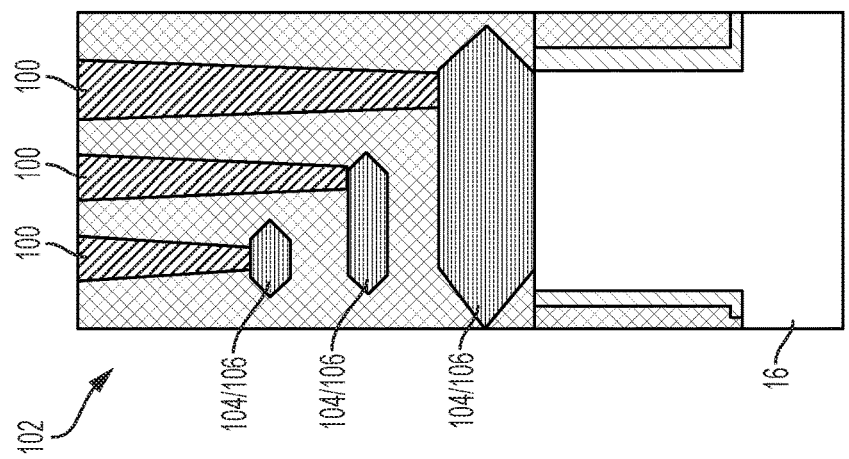
FIG. 6E depicts a cross-sectional view of a completed semiconductor device.
Figure 6D:
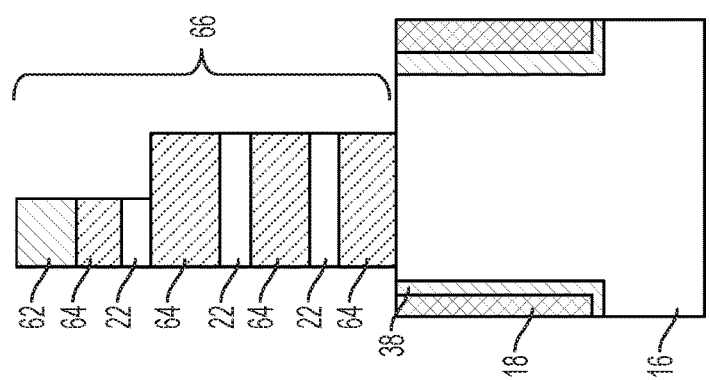
FIG. 6D depicts a cross-sectional view of the intermediate semiconductor device of FIG. 8A after a third reactive ion etch process.
Figure 6C:
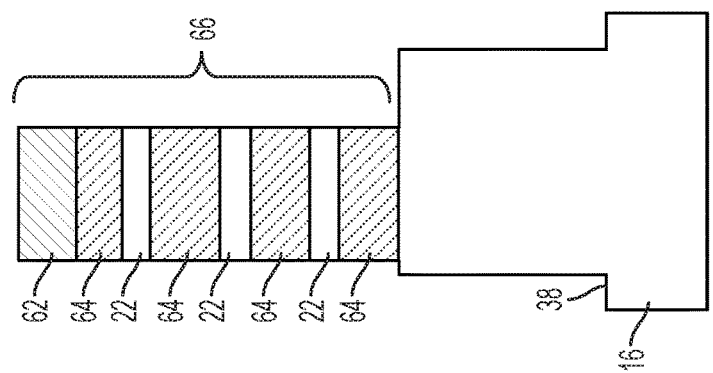
FIG. 6C depicts a cross-sectional view of the intermediate semiconductor device of FIG. 8A after a second reactive ion etch process.

After the hardmask layer 62 is deposited, a first etching process is performed on the stack, for example, a first reactive ion etching process as shown in FIG. 6B. In this first reaction ion etching process, a portion of the substrate 16 and each of the layers of the nanosheet stack 66 and the hardmask layer 62 are etched away forming recesses 38 on the substrate 16. A second reactive ion etching process is performed in FIG. 6C in order to remove further portions of the nanosheet stack 66. Inner spacers 38 are formed in the recesses and a shallow trench isolation layer 18 is formed on the inner spacers 30 as shown in FIG. 6D. A third reaction ion etching process is performed in FIG. 6D to further remove a portion of nanosheet stack 66. A pFET structure or nFET structure can be formed in channels left by each of the reactive ion etching processes to form a stacked device having at least three pFET structure 104 and/or nFET structure 106 devices stacked vertically with independent source or drain contacts 100 as shown in FIG. 6E. Although not shown and described with respect to FIG. 6A to 6E, the process described herein with respect to FIGS. 2 to 5 is equally applicable.

Each pFET structure and nFET structure in the nanosheet semiconductor device of FIG. 6 can have the same effective channel width and/or the same effective drive current.

A vertically stacked three-dimensional nanosheet semiconductor device can include at least three layers of vertically stacked pFET structure and nFET structure devices on a nanosheet stack. Each layer can have an independent source or drain contact.

Aspects of the present invention are described herein with reference to flowchart illustrations and/or block diagrams of methods, and apparatus (devices) products according to embodiments of the invention. The flowchart and block diagrams in the Figures illustrate the architecture, functionality, and operation of possible implementations of the device and method of fabricating the device according to various embodiments of the present invention. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or a unique combination of fabrication operations to fabricate the semiconductor device.

Figure 7:
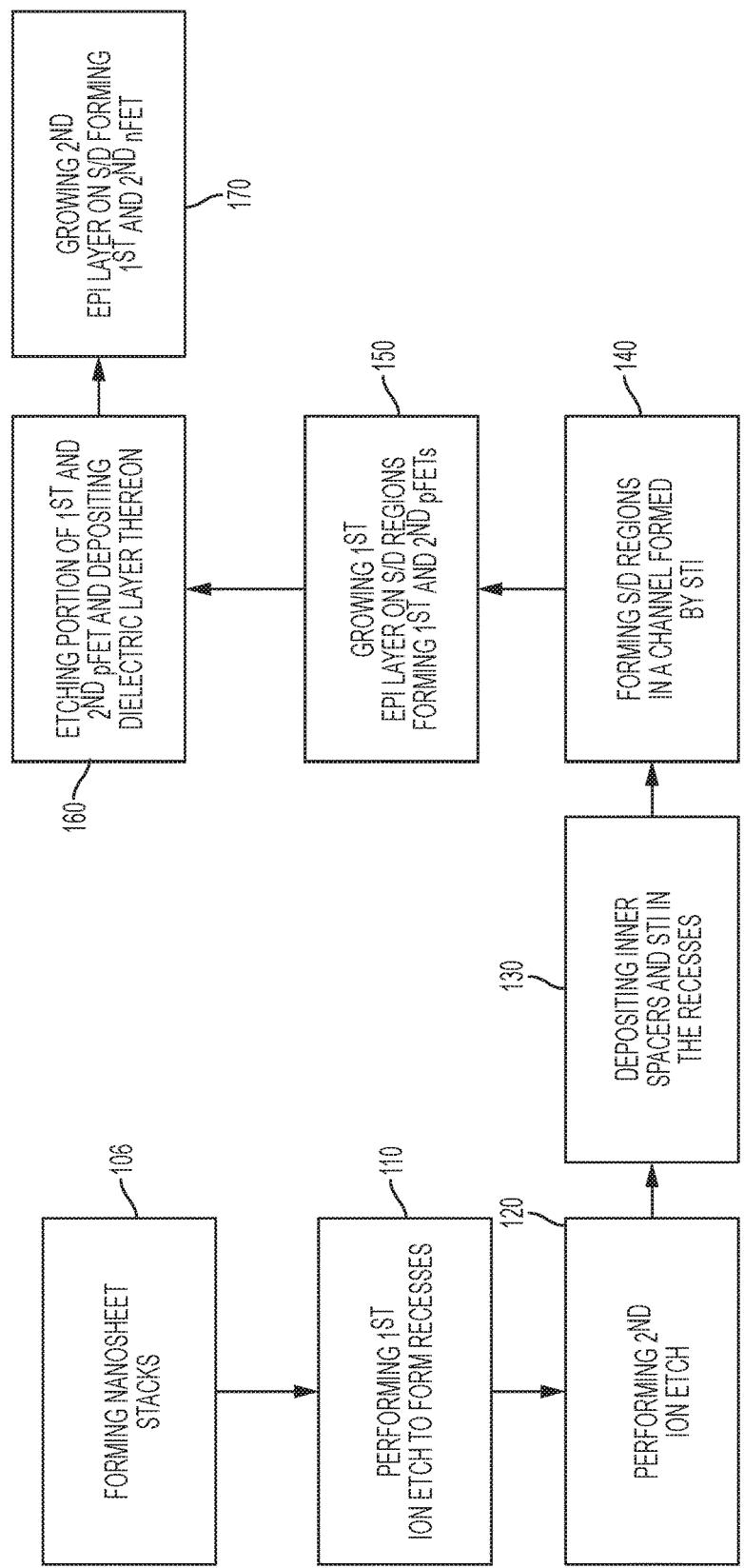
FIG. 7 depicts a flow diagram illustrating a method according to one or more embodiments of the invention.

A method of forming the semiconductor device is shown in FIG. 7 where nanosheet stacks are formed that include alternate silicon layers and silicon germanium layers on a substrate at 106. A first reaction ion etch is performed on the nanosheet stack at 110 to form recesses on the substrate. A second reactive ion etch is performed on the alternating layers of silicon and silicon germanium at 120. Inner spacers and a shallow trench isolation are deposited in the recesses at 130. Source and drain regions are formed in a channel formed by the shallow trench isolation at 140. A first epitaxy layer is grown on the source or drain regions forming a first pFET structure and a second pFET structure at 150. A portion of the first pFET structure and the second pFET structure are etched away and a dielectric deposited on the non-etched portions of the first pFET structure and the second pFET structure at 160. A second epitaxial layer is grown on the source or drain regions forming a first nFET structure and a second nFET structure at 170.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a vertically stacked nanosheet semiconductor device, the method comprising:
    forming a nanosheet stack by epitaxially growing alternating layers of a first material and a second material on a substrate and patterning a gate structure on the nanosheet stacks;
    performing a first reactive ion etch on the nanosheet stack forming recesses on the substrate;
    performing a second reactive ion etch on the alternating layers of the first material and the second material;
    depositing inner spacers and a shallow trench isolation layer in the recesses;

forming source or drain (S/D) regions in a channel formed by the shallow trench isolation layer;

growing a first epitaxial layer on the source or drain regions, forming a first pFET structure and a second pFET structure;

etching away a portion of the first pFET structure and the second pFET structure and depositing a dielectric layer on the first pFET structure and the second pFET structure; and growing a second epitaxial layer on the source or drain regions, forming a first nFET structure and a second nFET structure;

wherein at least one of the first pFET structure and the first nFET structure or the second pFET structure and the second nFET structure have individual contacts, wherein the individual contacts enable independent voltage control across the semiconductor device.

2. The method of claim 1, further comprising depositing a hardmask layer on a top layer of the nanosheet stack before the first reactive ion etching.

3. The method of claim 1, wherein at least one of the first pFET structure and the first nFET structure or the second pFET structure and the second nFET structure share a source or drain contact.

4. The method of claim 3, wherein a merge contact shape differs from individual contact shapes.

5. The method of claim 1, wherein the first and second pFET structure and the first and second nFET structure share a common gate.

6. The method of claim 1, wherein the first pFET structure and the first nFET structure are disposed vertically to one another.

7. The method of claim pFET structure nFET structure 1, wherein the first material comprises silicon and the second material comprises silicon germanium.

8. The method of claim 1, wherein the second pFET structure and the second nFET structure are disposed vertically to one another.

9. The method of claim 1, wherein the first epitaxial layer comprises silicon germanium.

10. The method of claim 1, wherein the second epitaxial layer comprises silicon epitaxy.

11. A method of fabricating a vertically stacked nanosheet semiconductor device, the method comprising:

epitaxially growing at least three layers each of alternating silicon and silicon germanium layers on a substrate, forming a nanosheet stack and patterning a gate structure on the nanosheet stacks;

performing at least three reactive ion etch processes on the nanosheet stack, forming recesses on the substrate;

forming source or drain regions in a channel formed by a shallow trench isolation layer formed in the recesses;

growing a first epitaxial layer on the source or drain regions, and repeating the process at least two times to form at least three pFET structures;

etching away a portion of each of the pFET structures and depositing a dielectric layer on the each pFET structure; and growing a second epitaxial layer on the source or drain regions, and repeating the process at least two times to form at least three nFET structures;

wherein each layer of the pFET structure and nFET structure are stacked vertically and wherein each layer of the pFET structure and nFET structures have independent source or drain contacts.

12. The method of claim 11, wherein each pFET structure and nFET structure has the same effective channel width.

13. The method of claim 11, wherein each pFET structure and nFET structure has the same effective drive current.

14. The method of claim 11, wherein the first epitaxial layer comprises silicon germanium.

15. The method of claim 11, wherein the second epitaxial layer comprises silicon epitaxy.

16. The method of claim 11, wherein an area of the nanosheet semiconductor device is reduced by at least 40% as compared to a semiconductor device as compared to a semiconductor device without vertical stacking of the pFET structure and nFET structure.

* * * * *